United States Patent [19]

Hiroshima et al.

[11] 4,334,290
[45] Jun. 8, 1982

[54] MAGNETIC BUBBLE MEMORY ELEMENT WITH HEAT SINK

[75] Inventors: Minoru Hiroshima; Toshio Futami; Hirofumi Ohta, all of Mobara, Japan

[73] Assignee: Hitachi, Ltd., Tokyo, Japan

[21] Appl. No.: 42,995

[22] Filed: May 29, 1979

[30] Foreign Application Priority Data

Jun. 16, 1978 [JP] Japan ................................. 53-72157

[51] Int. Cl.³ .............................................. G11C 19/08
[52] U.S. Cl. .................................... 365/1; 174/16 HS
[58] Field of Search ...................... 365/1, 2, 19, 20, 21; 174/68.5, 16 HS; 338/51

[56] References Cited

U.S. PATENT DOCUMENTS 4,073,561 2/1978 Baranowski ................. 174/16 HS
4,178,635 12/1979 Rose ..................................... 365/19

FOREIGN PATENT DOCUMENTS 2848015 5/1979 Fed. Rep. of Germany .......... 365/1

OTHER PUBLICATIONS

Journal of Applied Physics—vol. 49, No. 3, Mar. 1978, pp. 1930–1932.
IEEE Transactions on Magnetics—vol.-Mag.-12, No. 6, Nov. 1976, pp. 618–621.
IEEE Transactions on Magnetics—vol. Mag.-9, No. 3, Sep. 1973, pp. 485–488.

Primary Examiner—James W. Moffitt
Attorney, Agent, or Firm—Charles E. Pfund

[57] ABSTRACT

A magnetic bubble memory element has a conductor pattern layer including a hair pin shaped conductor loop for generating or dividing magnetic bubbles. A heat sink pattern layer is provided close to the hair pin portion of the conductor loop and may be formed integrally with the loop.

4 Claims, 7 Drawing Figures

MAGNETIC BUBBLE MEMORY ELEMENT WITH HEAT SINK

BACKGROUND OF THE INVENTION

The present invention concerns a magnetic bubble memory element, and more particularly it concerns the construction of a conductor loop for generating or dividing magnetic bubbles wherein even when generation or division of magnetic bubbles is repeated for a long time, such erroneous operations as the excessive generation of magnetic bubbles and the extinction of necessary magnetic bubbles can be prevented. Widespread use has hitherto been made to magnetic bubble memory elements of so-called pulse current type wherein pulse current is passed through a hair pin shaped conductor loop to generate or divide the magnetic bubbles.

Figure 1:
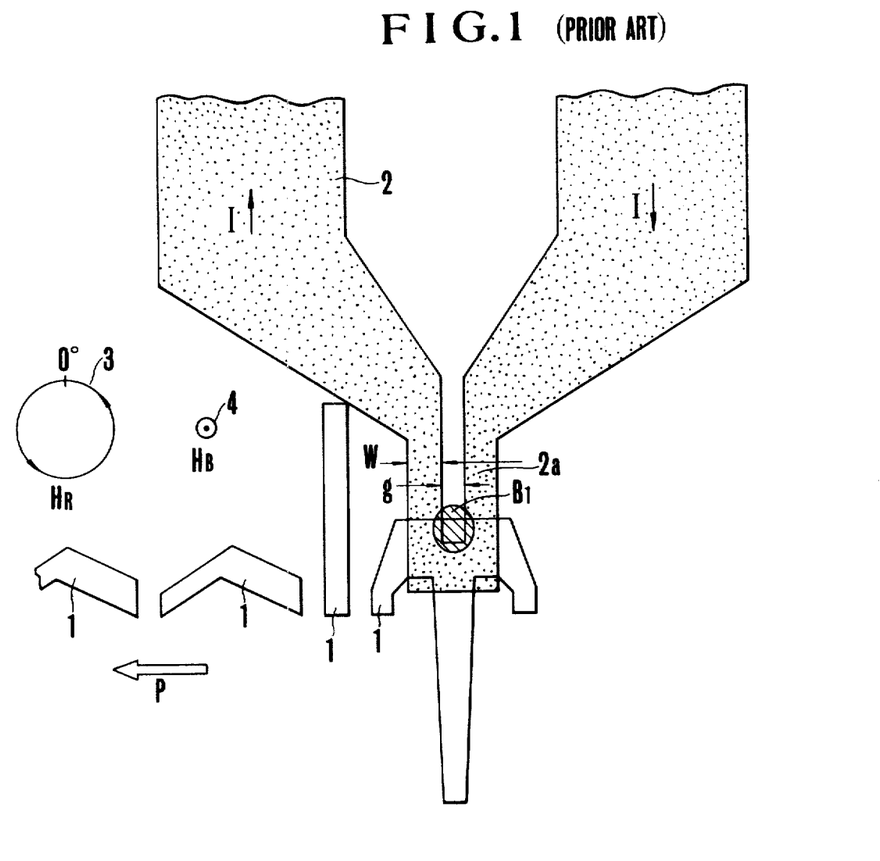
FIG. 1 is plan view of the main part of an example of the conventional conductor pattern for generating magnetic bubbles.

FIG. 1 shows the main part of one example of the conductor pattern for generating magnetic bubbles which is designed for use in the pulse current type magnetic bubble memory. In the figure, reference numeral 1 designates pattern layer segments constituting a magnetic bubble propagation circuit, the propagation circuit segment 1 being a fine pattern of a soft ferromagnetic thin film such as made from permalloy. Reference numeral 2 designates a hair pin shaped conductor loop of a conductor pattern layer through which is passed working current, the conductor loop 2 being a non-magnetic, conductive thin film.

Ordinarily, the magnetic bubble propagation circuit pattern layer and the conductor pattern layer are laminated in the direction vertical to the sheet of drawing, with a hair pin portion 2a of the conductor loop positioned in such a way that it crosses the propagation circuit segment 1. A rotating magnetic field 3 ($H_R$) which is applied to the pattern layers from outside rotates in a counterclockwise direction so as to propagate the magnetic bubbles from right to left (in the direction of the arrow p). A bias magnetic field 4 ($H_B$) acts from rear to front of the sheet of drawing in order to stably keep the magnetic bubbles on the propagation circuit.

In the magnetic bubble memory element thus constructed, the magnetic bubbles are generated in the following manner. When the rotating magnetic field 3 ($H_R$) turns to the vicinity of 0°, the working pulse current I is supplied to the conductor loop 2. Then, the pulse current I flows in the direction to weaken the bias magnetic field 4 ($H_B$) so that magnetic bubbles $B_1$ are generated within the loop of the hair pin portion 2a of the conductor loop. The magnetic bubbles $B_1$ propagate over the propagation circuit from right to left (in the direction of the arrow p) in accordance with the rotation of the rotating magnetic field 3 ($H_R$).

With the conventional magnetic bubble memory element as described above, however, such erroneous operations as the excessive generation of magnetic bubbles and the extinction of necessary magnetic bubbles are encountered in the repeating generation for a long time of the magnetic bubbles by supplying pulse current I to the conductor loop 2. That is to say, the magnetic bubbles are generated by passing a working pulse current I of 200 mA to 400 mA amplitude and 100 ns to 300 ns pulse width through the conductor loop 2. When such a pulse current I flows through the hair pin portion 2a of the conductor loop 2, there is generated Joule heat. Particularly the pulse current I of that amplitude raises the current density J at the hair pin 2a of the conductor loop 2 to an extremely high value of $10^7$ A/cm$^2$, thereby accelerating the heat generation at the conductor loop 2 by Joule heat, and raising the temperature in the conductor loop 2 to very high values. As will be seen from the temperature distribution shown in FIG. 2, the temperature at the tip of the hair pin part 2a rises to about 90° C. whereas the temperature is about 10° C. at the root adjacent to the hair pin 2a.

Figure 2:
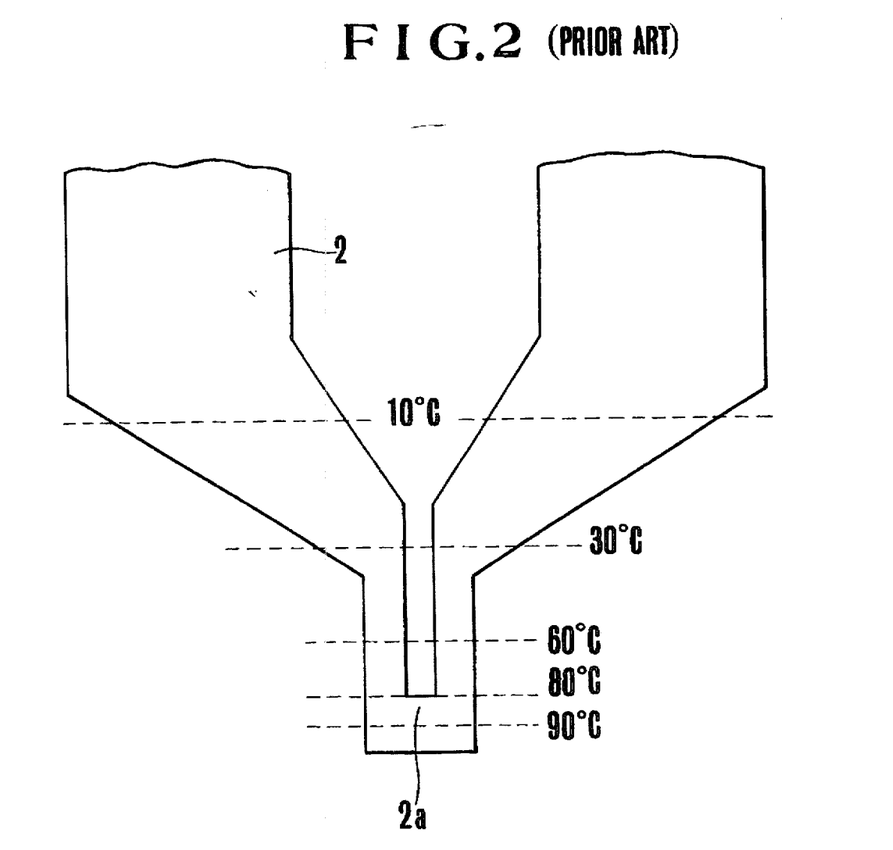
FIG. 2 is a diagrammatic representation showing the temperature rise at various points of the conductor loop of the conductor pattern shown in FIG. 1.

Such an abnormally high and localized temperature at the tip of the hair pin portion 2a will hinder normal magnetic bubble generation and propagation, and will cause the erroneous operations in which magnetic bubbles are generated excessively and/or magnetic bubbles once generated are forced to disappear.

SUMMARY OF THE INVENTION

An object of the present invention is, therefore, to provide a magnetic bubble memory element capable of minimizing the temperature rise at the hair pin portion to prevent the erroneous operations.

In order to achieve the above object, the magnetic bubble memory element of the present invention is characterized by the provision of a heat sink pattern layer at the tip of the hair pin of the conductor loop.

DESCRIPTION OF THE PREFERRED EMBODIMENTS

Figure 3:
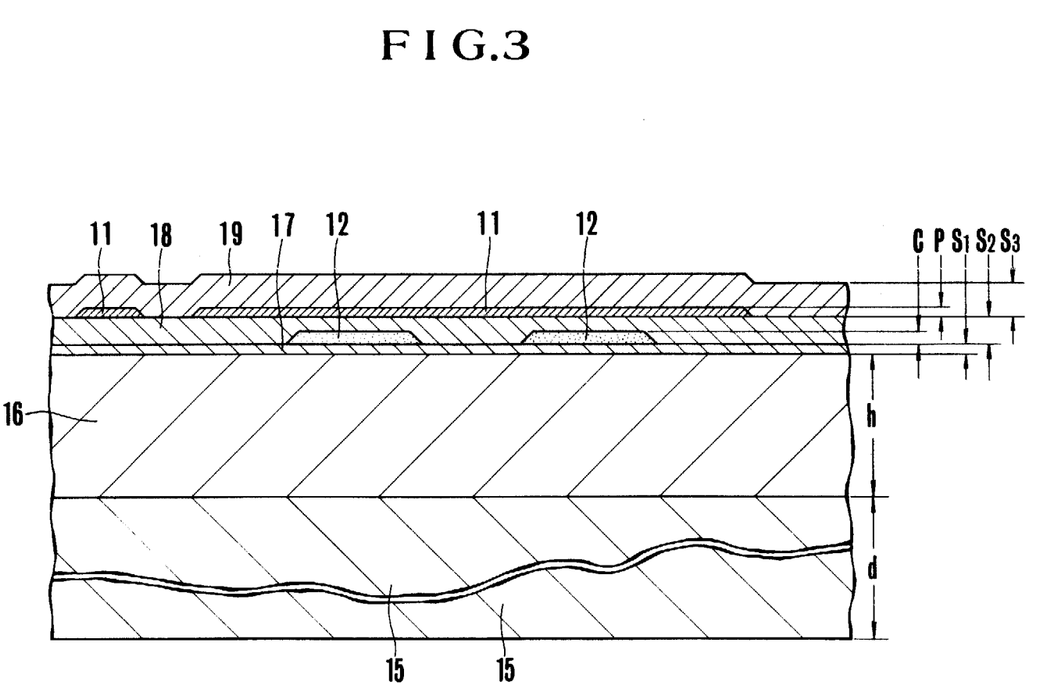
FIG. 3 is a longitudinal sectional view of one example of the magnetic bubble memory element to which the present invention is applied.

Referring to FIG. 3, a multi-layer structure of a magnetic bubble memory element to which the present invention is applied will first be described. In the figure, reference numeral 15 denotes a single crystalline substrate of garnet including gadolinium and gallium (so-called G. G. G. substrate) on which is formed by epitaxial growth process a magnetic film 16 which is a single crystalline, magnetic thin film for forming and maintaining the magnetic bubbles. On the surface of this magnetic bubble forming magnetic film 16 is formed, via an insulating spacer film 17 of, for example, SiO$_2$, Al$_2$O$_3$ or Si$_3$N$_4$, a conductor pattern layer 12 including a hair pin shaped conductor loop by vapor-depositing Al-Cu, or Au-Mo. On this conductor pattern layer 12 acting to generate or divide the magnetic bubbles is formed another pattern layer 11 including a propagation circuit and made of a soft ferromagnetic thin film such as of permalloy via an insulating spacer film 18 comprising of the same material as above or made of polyimide resin. The surface of the layer 11 is covered with a passivation film 19 made of SiO2, for example, to complete a magnetic bubble memory element chip. One example of film thicknesses for respective layers is as follows.

The film thicknesses d, h, S1, S2, C, P and S3 of the garnet single crystalline substrate 15, magnetic bubble forming magnetic film 16, spacer films 17 and 18, conductor pattern layer 12, propagation circuit pattern layer 11 and passivation film 19 are 0.4 to 0.5 mm, 2 to 4μ, 1000 to 4000 Å, 4000 to 10000 Å, 3000 to 5000 Å, 3000 to 4500Å and 6000 to 10000 Å, respectively.

Figure 4:
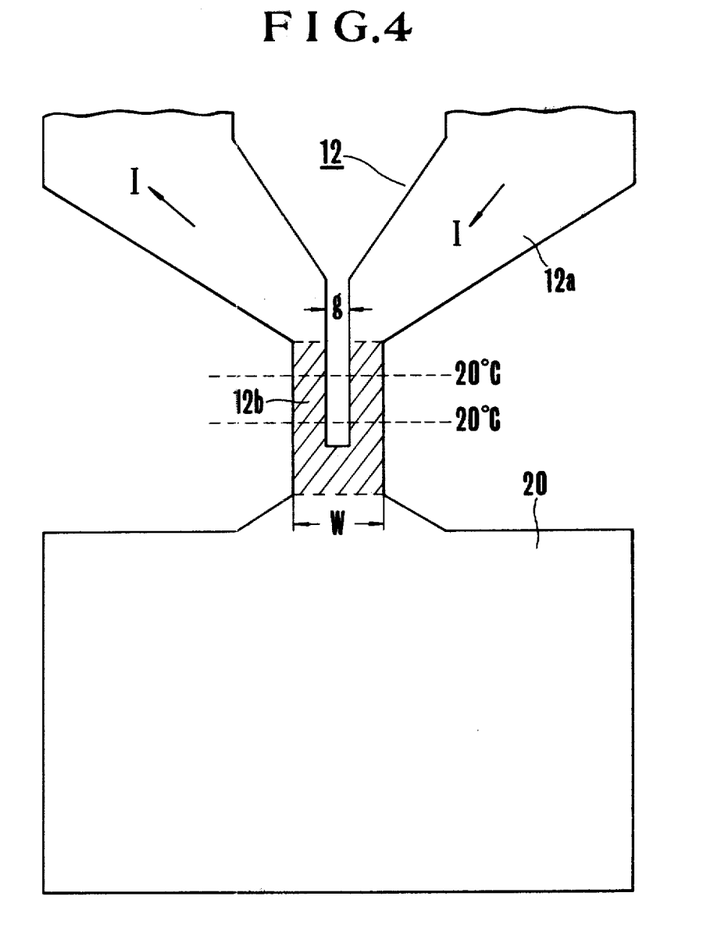
FIG. 4 is a plan view of the main part of an embodiment of the magnetic bubble memory element, particularly of the conductor loop for generating magnetic bubbles in accordance with the present invention.

FIG. 4 shows the conductor loop of the conductor pattern for generating magnetic bubbles embodying the present invention. As shown, a hair pin portion 12b (hatched portion) of a conductor loop 12a of the conductor pattern layer 12 forms a loop, and at the tip of the hair pin is formed a heat sink pattern layer 20 which is integral with the layer 12 and extends therefrom. The heat sink pattern layer 20 made of the same metallic material as the conductor pattern 12 and being of the same film thickness as the conductor pattern layer is flush with the conductor pattern layer 12. The heat sink pattern layer 20 extends away from the hair pin portion.

Preferably, the heat sink pattern layer 20 is designed as follows.

TABLE 1

| Materials | Heat Conductivity (W/cm °C.) |
|---|---|
| Al | 2.38 |
| Au | 3.11 |
| SiO2 | 0.014 |
| Magnetic bubble forming magnetic film | 0.028 |
| Substrate | not more than 0.03 |

As is clear from the heat conductivity of the layers of the multi-layer structure listed in Table 1, in comparison with the heat conductivity of the conductor pattern layer 12 (made of Al-Cu), the heat conductivity of the others (SiO2 film, bubble magnetic film, garnet single crystalline substrate) is smaller by orders of about two. That is, the conductor loop 12a is covered with a heat insulating material having a small heat conductivity. Therefore, it is preferred that the surface area of the heat sink pattern 20 be designed to be bigger than the surface area of the hair pin portion 12b of the conductor loop where the heat generates (hatched portion) by more than 2 orders or more than 10 times. Width W of the hair pin portion 12b of the conductor loop 12a is 3 to 7μ and gap g is 1 to 3μ.

As the heat sink pattern layer 20 is provided at the tip of the hair pin 12b so as not to overlap the propagation circuit, there is no possibility that the heat sink pattern layer affects the propagation of magnetic bubbles electromagnetically. Although the hair pin 12b and the heat sink pattern layer 20 are formed integrally with each other, the pulse current I passes the shortest distance along the gap of the hair pin portion and the current distribution is hardly disturbed. In addition to the heat dissipation via the insulating materials disposed around the hair pin portion, the heat generated in the hair pin portion is effectively dissipated through the big surface area heat sink pattern layer, so that the thermal resistance in the vertical and horizontal directions are considerably decreased and the temperature rise at the hair pin portion is most effectively suppressed. Practically, the temperature rise at the hair pin 12b was greatly reduced to about 20° C. as shown in FIG. 4, and satisfactory dissipation effect was achieved.

Figure 5:
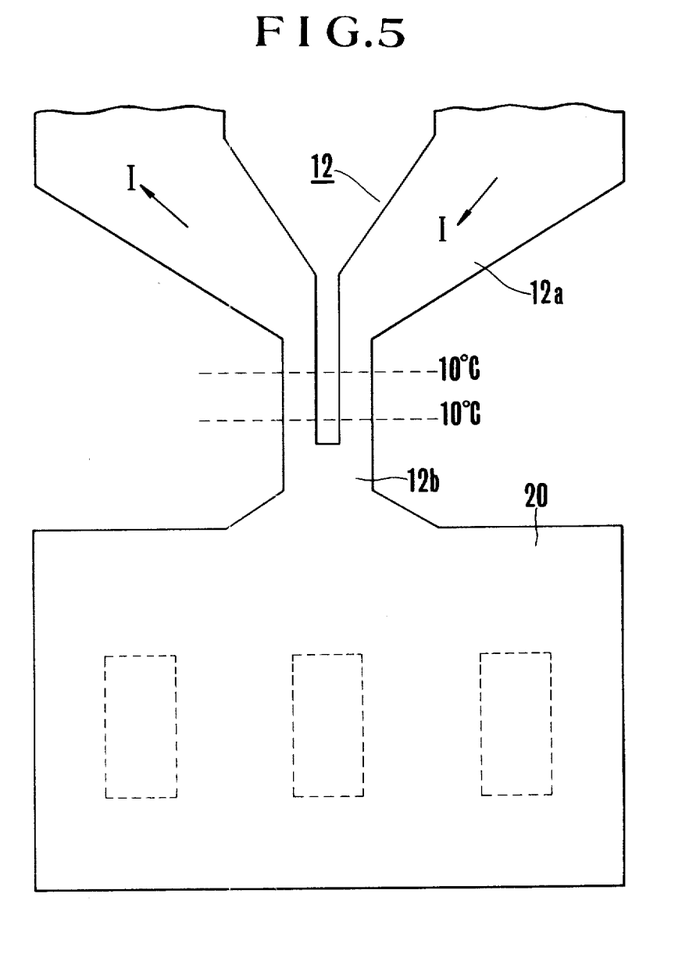
FIG. 5 is a plan view of the main part of another embodiment of the magnetic bubble memory element in accordance with the present invention, particularly of the conductor loop for generating magnetic bubbles.
Figure 6:
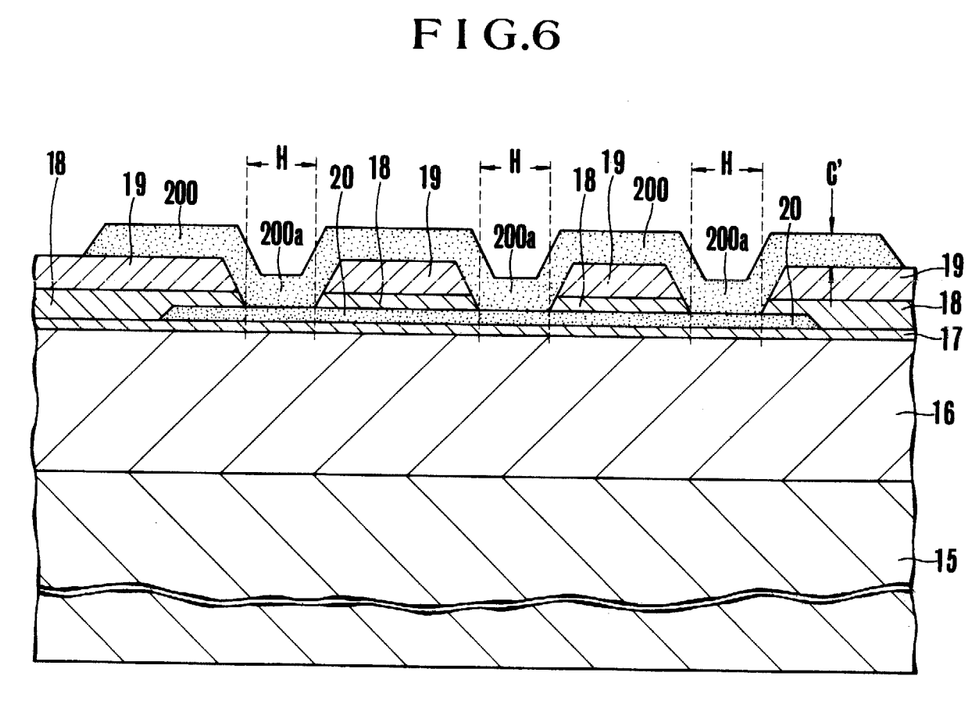
FIG. 6 is a longitudinal sectional view of a magnetic bubble memory element having the conductor loop of FIG. 5.

FIGS. 5 and 6 show another embodiment of the conductor loop for generating magnetic bubbles, with the same reference numerals denoting the corresponding parts in FIG. 4. In this embodiment, there are formed a plurality of through holes H in the layers overlying a first heat sink pattern layer 20 which is the same as that of FIG. 4, at given positions (indicated by dotted lines in FIG. 5) on the first pattern layer 20. Over a passivation film 19 is deposited a second heat sink pattern layer 200 comprising Al-Cu, etc. and having the thickness c' of 5000 Å to 2μ. Portions 200a of the second said 2nd heat sink pattern layer 200 come in contact with the first sink pattern 20 via the three through holes H.

In the conductor loop for generating magnetic bubbles as constructed above, there is provided, on the surface of the passivation film 19 or on the surface of the element, the second heat sink pattern layer which is partly in contact with the first heat sink pattern layer 20, thereby allowing the heat absorbed by the first heat sink pattern 20 to be dissipated to the surface of the element via the through holes H, so that the temperature rise at the hair pin portion 12b of the conductor loop can be suppressed to about 10° C. or less.

Figure 7:
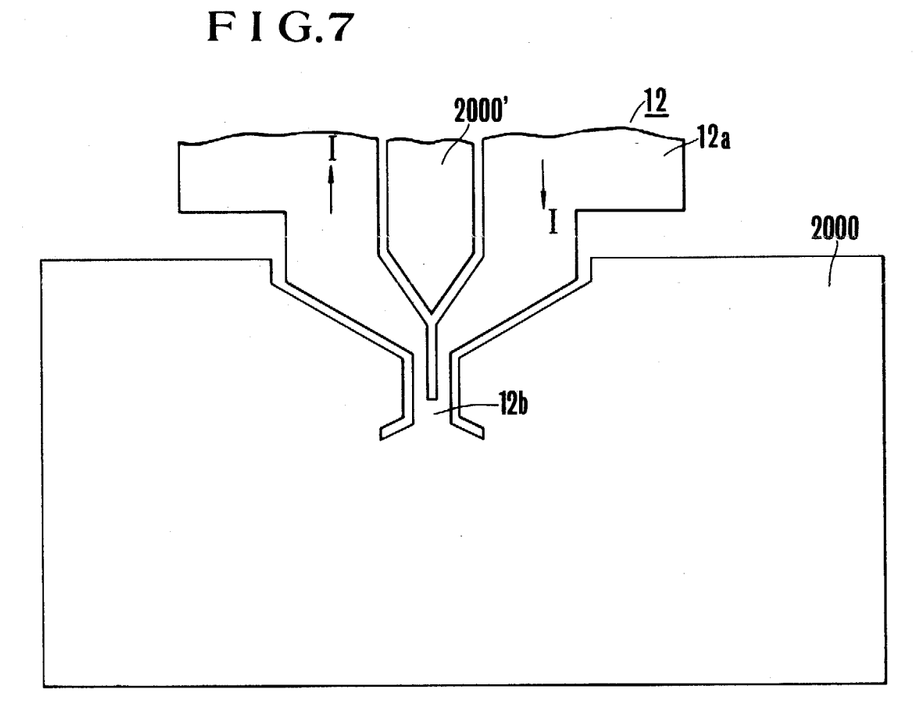
FIG. 7 is a plan view of the main part of still another embodiment of the magnetic bubble memory element in accordance with the present invention, particularly of the conductor loop for generating magnetic bubbles.

FIG. 7 shows still another embodiment of the magnetic bubble forming conductor loop in accordance with the present invention. In this figure, the hair pin portion 12b of the conductor loop 12a extends to form an integral heat sink pattern layer 2000 made of the same material as the conductor pattern layer, the layer 2000 also being such that it extends along the contour of the hair pin portion 12b with a suitable gap therebetween. Inside the conductor loop 12a is also formed separately another heat sink pattern layer 2000'. The layer 2000' is made of the same material as the conductor pattern and has the same thickness as the heat sink pattern 2000, thus being flush with the pattern 2000.

With this construction, the area for heat dissipation is enlarged and the heat resistance decreased so as to lower the temperature rise at the hair pin portion 12b to about 10° C. or less.

In the foregoing embodiments, the description was given of the instances where the heat sink patterns were provided at the tip of the hair pin portion of the magnetic bubble forming conductor loop, but it will be appreciated that the present invention is not to be limited to these instances, and that identical effects can be achieved when the invention is applied to the hair pin portion of the conductor loop for dividing the magnetic bubbles. As explained above, the magnetic bubble memory element according to the invention radically cuts down the temperature rise at the hair pin portion of the conductor loop, and achieves an extremely excellent effects of positively preventing such erroneous operations as the excessive generation of magnetic bubbles and the extinction of necessary magnetic bubbles.

What is claimed is:

1. In a magnetic bubble memory element wherein on a single crystalline substrate are laminated a magnetic thin film for forming and maintaining magnetic bubbles, an insulating spacer layer, a conductor pattern layer including hair pin shaped conductor loops for generating or dividing magnetic bubbles, an insulating layer, and a pattern layer including a magnetic bubble propagation circuit, in the above-mentioned order, the improvement wherein a heat sink pattern layer is integrally formed and coplanar with said conductor pattern layer, to form heat sinks extending from said hair pin loops each heat sink having a large coplanar area of said conductor material in thermal conductive contact with the tip of a loop by means of an integral conductive bridge which provides a wide heat conducting path from said tip to said large coplanar area without significant alteration of the path of flow of operating current around said loop.

2. A magnetic bubble memory element as claimed in claim 1 wherein the area of said heat sink pattern is made 10 or more times the surface area of said conductor loop hair pin portion.

3. In a magnetic bubble memory element wherein on a single crystalline substrate are laminated a magnetic thin film for forming and maintaining magnetic bubbles, an insulating spacer layer, a conduct or pattern layer including hair pin shaped conductor loops for generating or dividing magnetic bubbles, an insulating layer, and a pattern layer including a magnetic bubble propagation circuit, in the above-mentioned order, the improvement wherein a heat sink pattern layer is provided thermally coupled conductively to the hair pin portion of said conductor loop wherein said heat sink pattern layer is integrally formed with said conductor pattern layer on the same plane and extends away from said hair pin portion which further comprises a second heat sink pattern layer provided on the surface of the element and in contact with the first heat sink pattern layer at at least one point.

4. In a magnetic bubble memory element wherein on a single crystalline substrate are laminated a magnetic thin film for forming and maintaining magnetic bubbles, an insulating spacer layer, a conductor pattern layer including hair pin shaped conductor loops for generating or dividing magnetic bubbles, an insulating layer, and a pattern layer including a magnetic bubble propagation circuit, in the above-mentioned order, the improvement wherein a heat sink pattern layer is provided thermally coupled conductively to the hair pin portion of said conductor loop and wherein said heat sink pattern layer includes a first heat sink pattern layer formed integrally on the same plane with said conductor pattern layer and extending along the contour of said hair pin portion, and a second heat sink pattern layer formed inside the conductor loop and separately therefrom.

* * * * *